(12) United States Patent
Ohta (10) Patent No.: US 6,339,231 B1
(45) Date of Patent: Jan. 15, 2002

(54) GATE COMMUTATED TURN-OFF THYRISTOR MODULE

(75) Inventor: Kenji Ohta, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/625,000

(22) Filed: Jul. 25, 2000

(30) Foreign Application Priority Data

Feb. 1, 2000 (JP) ........................................ 2000-023778

(51) Int. Cl.[7] .............................................. H01L 29/744
(52) U.S. Cl. ...................... 257/147; 322/46; 323/207; 327/438; 327/440; 257/156
(58) Field of Search ............................. 322/46; 257/147, 257/156; 327/438, 440; 323/207

(56) References Cited

U.S. PATENT DOCUMENTS 6,163,200 A * 12/2000 Iijima ........................ 327/438

FOREIGN PATENT DOCUMENTS

| EP | 977261 A1 | * | 2/2000 | ........... H01L/23/48 |
| JP | 2000049330 A | * | 2/2000 | ........... H01L/29/74 |

* cited by examiner

Primary Examiner—Nathan Flynn
Assistant Examiner—Scott R. Wilson
(74) Attorney, Agent, or Firm—Oblon, Spivak, McClelland, Maier & Neustadt, P.C.

(57) ABSTRACT

A gate terminal plate (1) of a GCT thyristor (90), a connecting substrate (70) of a driving device and a cathode electrode plate (10) are interposed between a set of metal rings (7A) and (7C) fastened to each other with a screw (8). The cathode electrode plate (10) is connected to a cathode post electrode (31) of the GCT thyristor (90). The screw (8) is electrically insulated from the metal ring (7A) and the gate terminal plate (1) through an insulator (9). By this structure, the gate terminal plate (1) and the cathode electrode plate (10) are directly connected to a first metallized layer (5) and a second metallized layer (6) which are provided on two main surfaces of the connecting substrate (70) of the driving device, respectively. Thus, resistance and inductance components in a path for a gate current are reduced and an assembly is simplified.

5 Claims, 11 Drawing Sheets

GATE COMMUTATED TURN-OFF THYRISTOR MODULE

BACKGROUND OF THE INVENTION

1. Field of the Invention

The present invention relates to a gate commutated turn-off thyristor module, and more particularly to an improvement for reducing electric resistance and inductance components in a path for a gate current and simplifying an assembly.

2. Description of the Background Art

A gate turn-off thyristor (which will be hereinafter referred to as a "GTO" thyristor) has widely been utilized as a device suitable for application to large-capacity power electronics. However, the GTO thyristor has had a problem in that a snubber circuit is required and it is hard to prevent a snubber loss from being increased with a rise in an operating voltage. Instead, a gate commutated turn-off thyristor (hereinafter referred to as a "GCT thyristor") which has been developed as another device has an advantage that an operation can be carried out without the snubber circuit and the snubber loss can be eliminated.

The GCT thyristor serves to raise a rate of increase in a gate reverse current to approximately one hundred times as high as the GTO thyristor and to cause all main currents to flow to a gate circuit (that is, commutate all the main currents), thereby carrying out a turn-off operation. In order to carry out this operation, a GCT thyristor module incorporating a GCT thyristor and a driving device thereof has such a structure that the GCT thyristor and the driving device are connected to each other through a gate terminal plate provided like a ring in the GCT thyristor.

Figure 9:
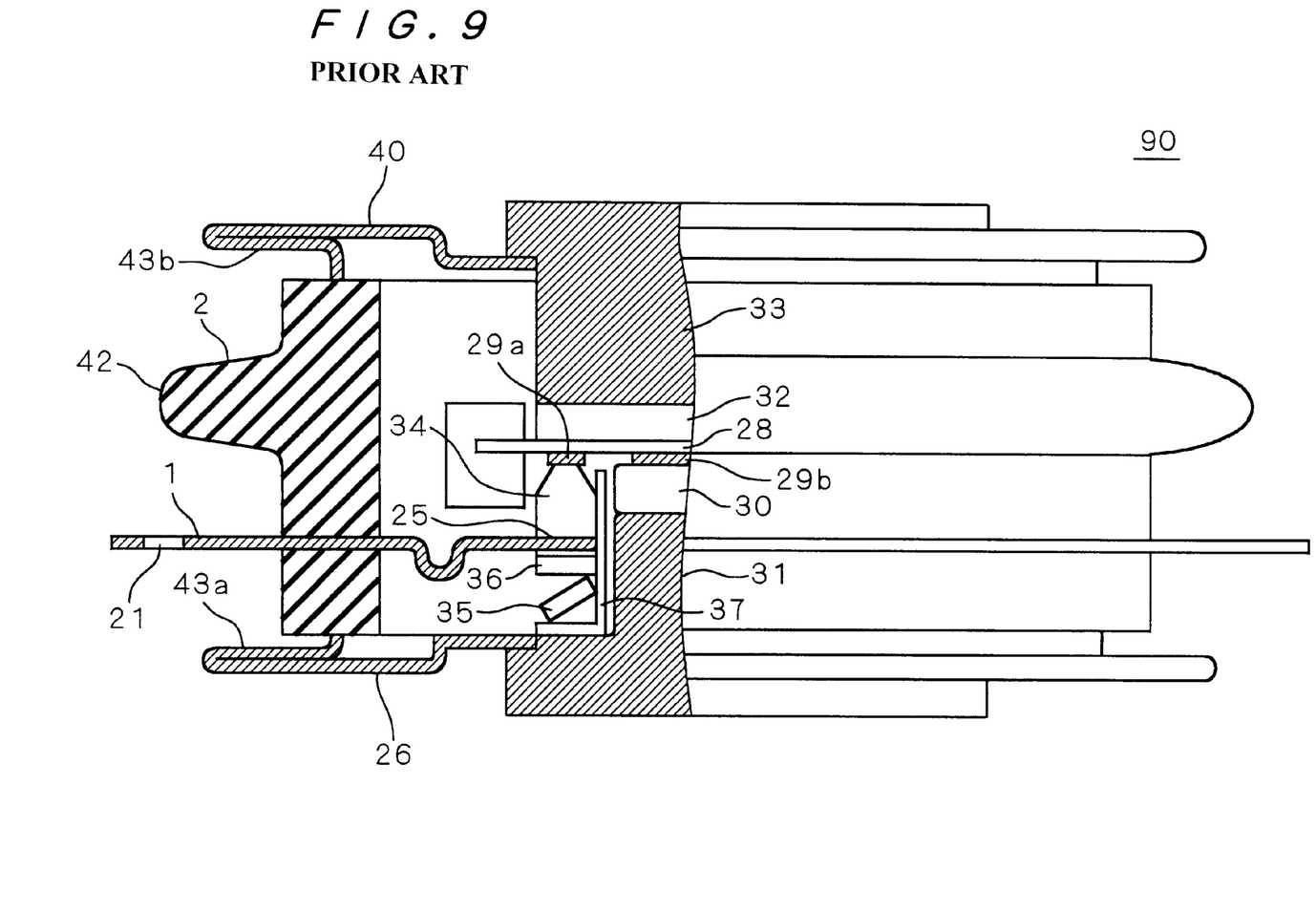
FIG. 9 is a partially sectional side view showing a conventional GCT thyristor.

FIG. 9 is a partially sectional side view showing a conventional GCT thyristor which is the background of the present invention. As shown in FIG. 9, a GCT thyristor 90 comprises a semiconductor substrate 28. In the semiconductor substrate 28, a plurality of (for example, several thousand) minute thyristor elements (not shown) connected in parallel with each other which are referred to as segments are arranged concentrically in a plurality of stages (for example, eight stages). Each thyristor element can be turned on and off by a gate current. Each cathode electrode 29b is formed in a position corresponding to each segment on a lower main surface of the semiconductor substrate 28, and a gate electrode 29a is formed in the vicinity of an outer peripheral portion of the lower main surface.

A cathode distortion buffer plate 30 and a cathode post electrode (main electrode) 31 are sequentially provided under the cathode electrode 29b. On the other hand, an anode distortion buffer plate 32 and an anode post electrode (main electrode) 33 are sequentially provided above an anode electrode (not shown) which is formed on an upper main surface of the semiconductor substrate 28.

Furthermore, a ring-shaped gate electrode 34 is provided in contact with the gate electrode 29a, and a gate terminal plate 1 formed as a ring-shaped metal plate is provided to slidably come in contact with the ring-shaped gate electrode 34 on an inner peripheral edge surface thereof. The gate terminal plate 1 and the ring-shaped gate electrode 34 are pressed against the gate electrode 29a by means of a ring-shaped elastic member 35. The elastic member 35 has a configuration of a ring-shaped belleville spring or corrugated spring and presses the gate terminal plate 1 through a ring-shaped insulator 36.

A sheet-shaped insulator 37 is provided along wall surfaces of the cathode distortion buffer plate 30 and the cathode post electrode 31. The insulator 37 serves to insulate the ring-shaped gate electrode 34 from the cathode distortion buffer plate 30 and the cathode post electrode 31.

A cathode flange 26 is fixed to an edge portion of the cathode post electrode 31 and an anode flange 40 is fixed to the anode post electrode 33. An insulating cylinder 2 constituted by an insulator such as ceramic is provided between the cathode flange 26 and the anode flange 40 to surround a main part of the GCT thyristor 90. The insulating cylinder 2 is divided vertically into two portions with the gate terminal plate 1 interposed therebetween, and further has a projection 42 to increase a creeping distance. The gate terminal plate 1 has an outer peripheral portion protruded like a ring from a side surface of the insulating cylinder 2 to the outside and can be thus connected to the outside. The insulating cylinder 2 is fixed in close contact with upper and lower surfaces of the gate terminal plate 1.

A ring-shaped connecting plate 43a is fixed to a lower end face of the insulating cylinder 2. The connecting plate 43a is further fixed to the ring-shaped cathode flange 26. Similarly, a ring-shaped connecting plate 43b is fixed to an upper end face of the insulating cylinder 2. The connecting plate 43b is further fixed to the ring-shaped anode flange 40. Thus, the GCT thyristor 90 has a package structure in which a housing chamber for accommodating the semiconductor substrate 28 and for being held airtightly with the outside is defined on the inside. The air in the housing chamber is substituted for an inert gas.

A plurality of mounting holes 21 are provided at a predetermined interval along an edge portion of the gate terminal plate 1. The GCT thyristor 90 has a disc-shaped appearance, which is not shown. The cathode post electrode 31, the cathode flange 26 and the gate terminal plate 1 are concentrically provided in order as seen from the lower surface. Moreover, the anode post electrode 33, the anode flange 40 and the gate terminal plate 1 are concentrically arranged in order as seen from the upper surface.

Figure 10:
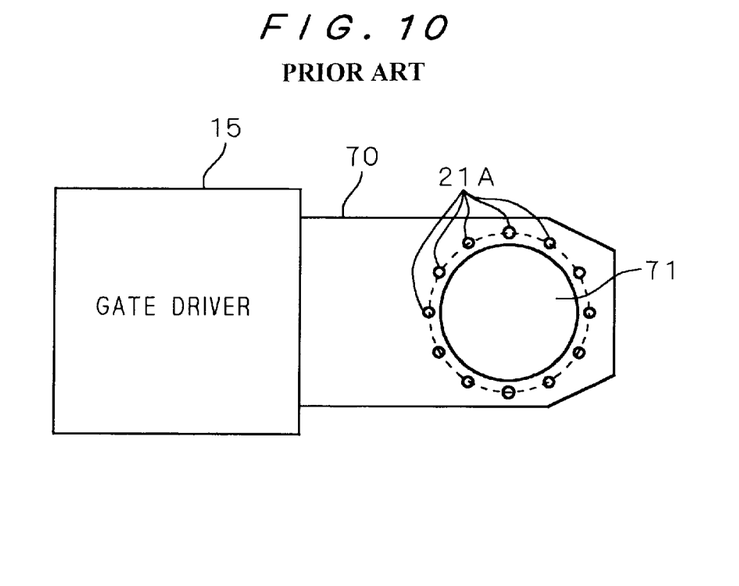
FIG. 10 is a plan view showing a conventional driving device.

FIG. 10 is a plan view showing a driving device to be connected to the GCT thyristor 90. The driving device includes a gate driver 15 acting as a circuit section and a connecting substrate 70. The connecting substrate 70 is a portion where a circuit substrate (not shown) belonging to the gate driver 15 is extended toward the outside on the side of the gate driver 15, has a wiring pattern (not shown) and serves to electrically relay the gate driver 15 and the GCT thyristor 90.

The connecting substrate 70 is provided with a thyristor inserting section 71 which is an opening for inserting the GCT thyristor 90. Around the thyristor inserting section 71 are provided a plurality of through holes 21A through which screws for fixing the gate terminal plate 1 of the GCT thyristor 90 penetrate. The cathode post electrode 31 is inserted into the thyristor inserting section 71 to be disposed on the underside, and thereafter, the GCT thyristor 90 is fixed to the connecting substrate 70 with a screw. Thereby, a GCT thyristor module is completed.

Figure 11:
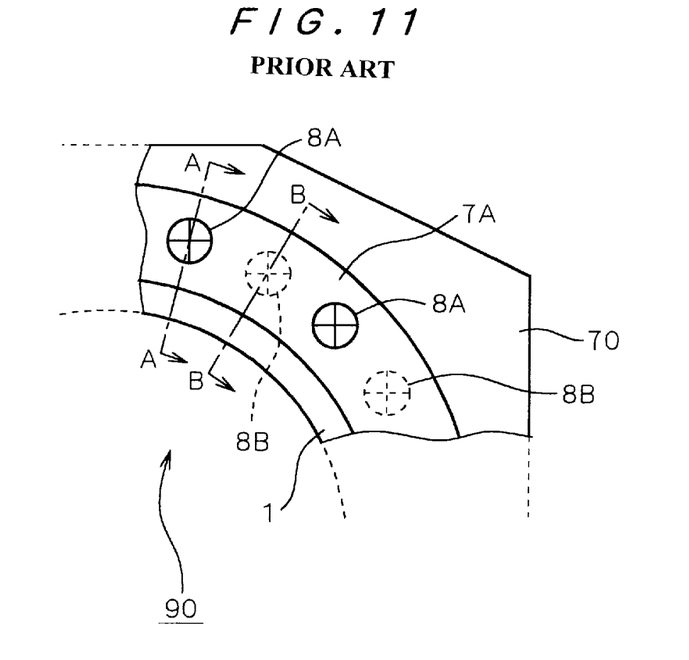
FIG. 11 is a partial plan view showing a conventional module.
Figure 12:
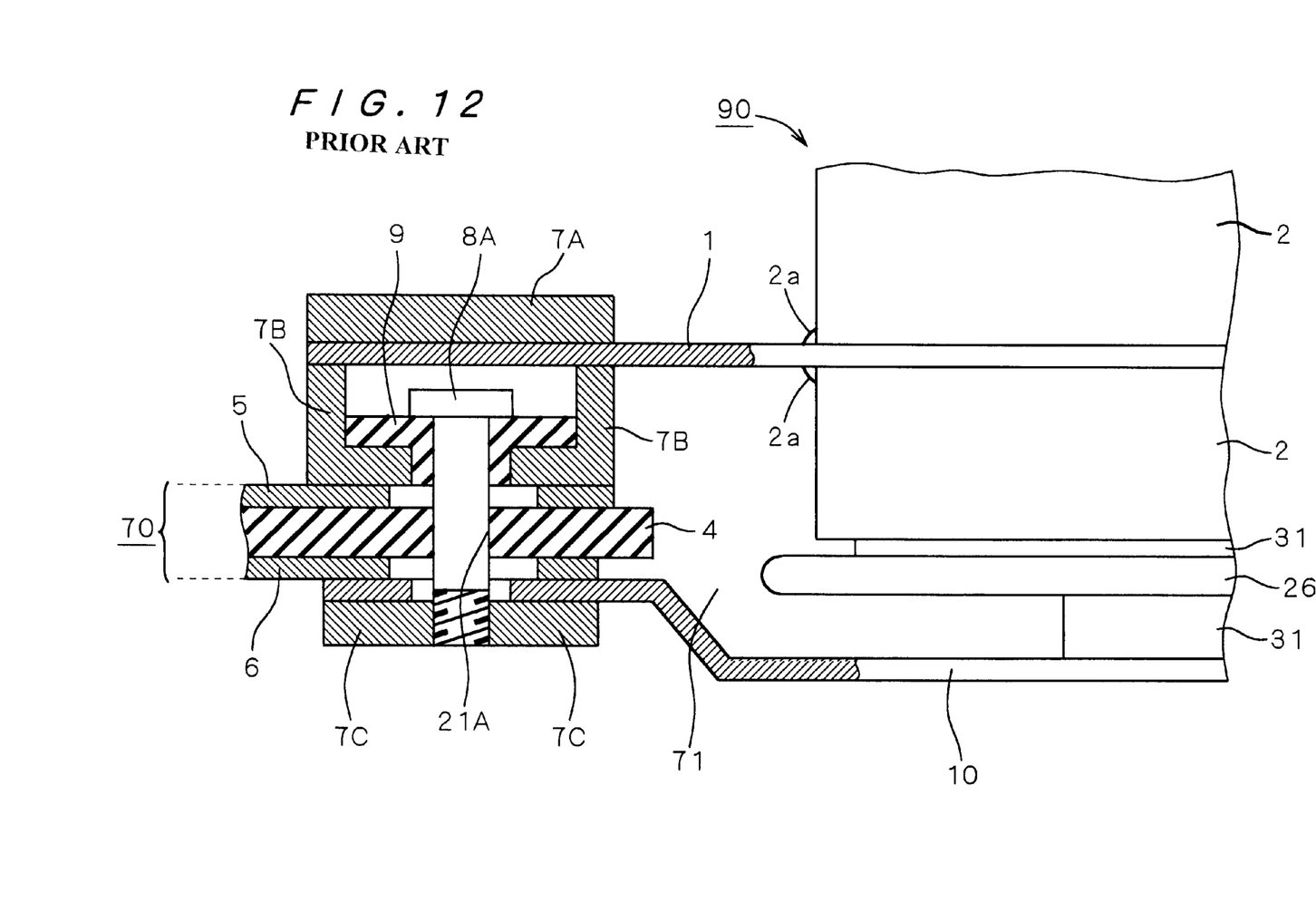
FIGS. 12 and 13 are partially sectional side views showing the conventional module.

FIG. 11 is a partially enlarged plan view showing a part of the periphery of the thyristor inserting section 71 which is obtained after the GCT thyristor 90 is fixed to the connecting substrate 70 and the GCT thyristor module is assembled. FIG. 12 is a sectional view taken along the line A—A in FIG. 11, and FIG. 13 is a sectional view taken along the line B—B in FIG. 11.

Figure 13:
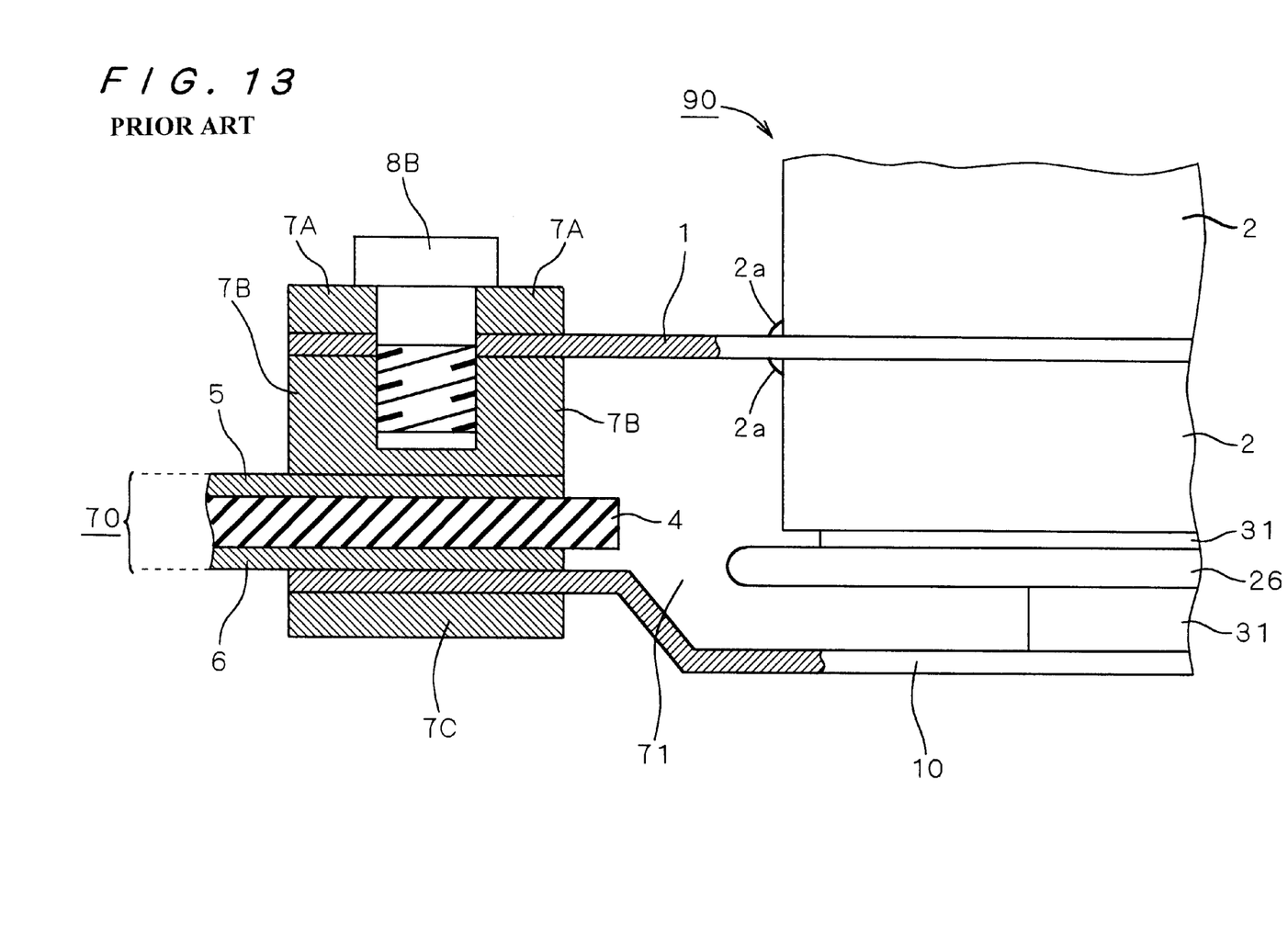

As shown in FIGS. 11 to 13, the GCT thyristor 90 is fixed to the connecting substrate 70 through two kinds of screws 8A and 8B, three kinds of metal rings 7A, 7B and 7C and a metallic cathode electrode plate (main electrode plate) 10. Each of the metal rings 7A, 7B and 7C and the cathode electrode plate 10 has a high electric conductivity.

The gate terminal plate 1 fixed to the insulating cylinder 2 through a soldering 2a is interposed between the upper metal ring 7A and the middle metal ring 7B, and is fixed thereto with the screw 8B. The cathode electrode plate 10 abutting on the lower main surface of the cathode post electrode 31 and the connecting substrate 70 are interposed between the middle metal ring 7B and the lower metal ring 7C and are fixed thereto with the screw 8A. Consequently, the GCT thyristor 90 and the connecting substrate 70 are fixed to each other.

The connecting substrate 70 has an insulating plate 4, a first metallized layer (first conductive layer) 5 formed on an upper main surface of the insulating plate 4 and a second metallized layer (second conductive layer) 6 formed on a lower main surface of the insulating plate 4. Moreover, an insulator 9 is provided between the screw 8A and the metal ring 7B. Accordingly, the gate terminal plate 1 is electrically connected to the first metallized layer 5 through the metal ring 7B, and the cathode post electrode 31 is electrically connected to the second metallized layer 6 through the cathode electrode plate 10.

The GCT thyristor module is used with the cathode post electrode 31 (directly, the cathode electrode plate 10) and the anode post electrode 33 interposed and pressed between a pair of external main electrodes which are not shown. More specifically, the GCT thyristor 90 is a kind of pressure contact type semiconductor device.

When the GCT thyristor 90 is to be turned on, the gate driver 15 causes a current to flow from the first metallized layer 5 to the gate terminal plate 1 such that the current flows from the gate electrode 29a (FIG. 9) toward the cathode electrode 29b. At this time, a rate of increase in the gate current is usually 100 A/$\mu$s or more.

On the other hand, when the GCT thyristor 90 is to be turned off, the gate driver 15 raises the rate of increase in a gate reverse current so that all the main currents flowing from the anode post electrode 33 to the cathode post electrode 31 are commutated as gate reverse currents to the gate driver 15 through the gate terminal plate 1. In general, the rate of increase in the gate reverse current is approximately several thousands A/$\mu$s. Consequently, a main current of several thousands A of the GCT thyristor 90 is commutated to the gate terminal plate 1 in a short time of approximately 1 $\mu$s.

In the GCT thyristor module shown in FIGS. 9 to 13, the gate terminal plate 1 is formed like a ring and a great contact area of the gate terminal plate 1 with the driving device is maintained. Therefore, resistance and inductance components in a path for a gate current (including a gate reverse current) can be reduced. Consequently, the turn-off operation can be achieved.

In the conventional GCT thyristor module, however, the metal ring 7B is provided between the gate terminal plate 1 and the first metallized layer 5. Correspondingly, the resistance and inductance components in the path for the gate current are high and the driving operation of the GCT thyristor having a greater main current is obstructed. Furthermore, since the metal ring 7B is provided, there is a problem in that the number of parts of the driving device is large and it takes a long time to assemble the GCT thyristor module.

SUMMARY OF THE INVENTION

In order to solve the above-mentioned problems of the prior art, it is an object of the present invention to provide a GCT thyristor module capable of reducing resistance and inductance components in a path for a gate current and of simplifying an assembly.

A first aspect of the present invention is directed to a gate commutated turn off thyristor module comprising a gate commutated turn-off thyristor including a semiconductor substrate in which a thyristor element is fabricated, a set of main electrodes provided with the semiconductor substrate interposed therebetween, an insulating cylinder surrounding the semiconductor substrate and the set of main electrodes, and a gate terminal plate electrically connected to a gate electrode of the thyristor element and projected like a ring on an outer periphery of the insulating cylinder, a driving circuit including a circuit section for supplying a gate current to the gate terminal plate, and a connecting substrate having an insulating plate and first and second conductive layers respectively provided on first and second main surfaces of the insulating plate and electrically connected to the circuit section, a conductive main electrode plate electrically connected to one of the main electrodes, a set of rings provided to interpose the gate terminal plate and the main electrode plate therebetween with the gate terminal plate abutting on the first conductive layer and the main electrode plate abutting on the second conductive layer, a screw for fastening the set of rings to each other, and an insulator for electrically insulating the screw from the gate terminal plate and one of the rings contacting with the gate terminal plate or from the main electrode plate and the other ring contacting with the main electrode plate.

A second aspect of the present invention is directed to the gate commutated turn-off thyristor module according to the first aspect of the present invention, wherein the insulator is a cylinder having a flange on one of ends on which a head of the screw abuts, penetrating through the gate terminal plate and one of through the rings or the main electrode plate and the other ring and causing the screw to penetrate therethrough.

A third aspect of the present invention is directed to the gate commutated turn-off thyristor module according to the second aspect of the present invention, wherein the cylinder also penetrates through the first and second conductive layers.

A fourth aspect of the present invention is directed to the gate commutated turn-off thyristor module according to any of the first to third aspects of the present invention, wherein a material of the main electrode plate is a non-magnetic substance.

A fifth aspect of the present invention is directed to the gate commutated turn-off thyristor module according to any of the first to fourth aspects of the present invention, wherein a notch is formed in a portion other than the portion through which the screw penetrates in an annular region of the gate terminal plate covered with one of the rings.

According to the first aspect of the present invention, a ring is not provided between the gate terminal plate and the first conductive layer but they are directly connected to each other. Therefore, resistance and inductance components in a path for a gate current can be reduced. Consequently, a greater main current can be commutated. Moreover, the number of parts can be decreased. Thus, an assembly can be simplified and the cost of the assembly can be reduced.

According to the second aspect of the present invention, the insulator is the cylinder having the flange. Therefore, the insulation between the gate terminal plate, the main electrode plate or the like and the screw can be achieved reliably without requiring a complicated work at an assembling process.

According to the third aspect of the present invention, the cylinder acting as the insulator also penetrates through the first and second conductive layers. Therefore, the insulating properties between the first and second conductive layers and the screw can be enhanced.

According to the fourth aspect of the present invention, the material of the main electrode plate is a non-magnetic substance. Therefore, it is possible to prevent heat generation from being caused by a high-frequency operation.

According to the fifth aspect of the present invention, the notch is formed in a portion other than the portion in the gate terminal plate through which the screw penetrates, that is, a portion where comparatively small press force acts between the gate terminal plate and the first conductive layer. Therefore, a material of the gate terminal plate can be reduced without greatly influencing the resistance and inductance components in the path for a gate current.

These and other objects, features, aspects and advantages of the present invention will become more apparent from the following detailed description of the present invention when taken in conjunction with the accompanying drawings.

DESCRIPTION OF THE PREFERRED EMBODIMENT

A GCT thyristor module according to an embodiment of the present invention is characteristically different from a conventional GCT thyristor module in that a middle metal ring 7B is removed and a gate terminal plate 1 and a first metallized layer 5 are directly connected to each other. In the following drawings, the same portions or corresponding portions having the same functions as those of the GCT thyristor module shown in FIGS. 9 to 13 are indicated as the same reference numerals and their detailed description will be omitted.

Figure 1:
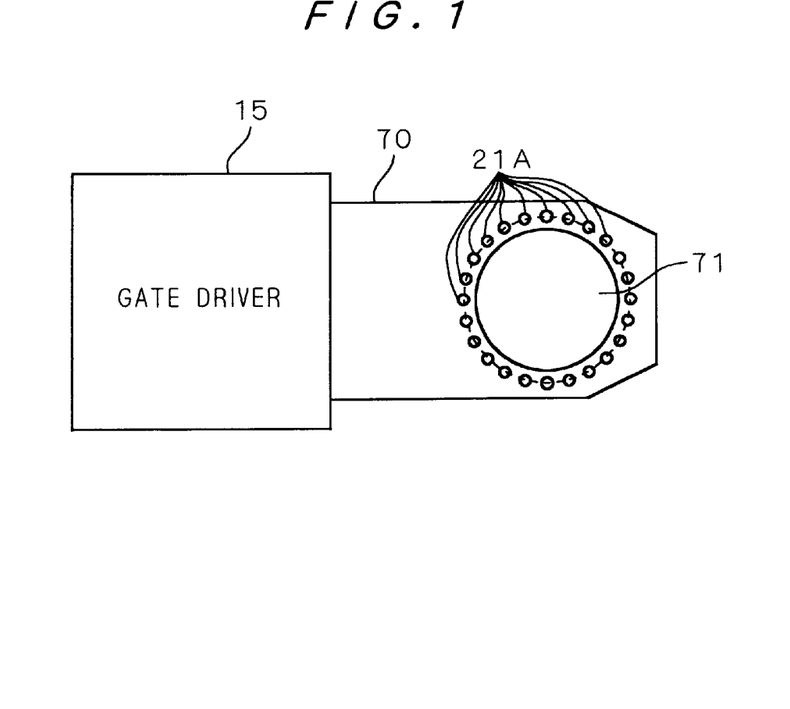
FIG. 1 is a plan view showing a driving device according to an embodiment.

FIG. 1 is a plan view showing a driving device as a component of the GCT thyristor module according to the embodiment. The driving device according to the embodiment has the same basic structure as that in the conventional driving device shown in FIG. 10. FIG. 1 shows an example in which more through holes 21A than those in FIG. 10 are formed around a thyristor inserting section 71. The GCT thyristor module according to the present invention is, however, not restricted to this example.

A GCT thyristor acting as a component of the GCT thyristor module according to the embodiment has the same structure as that of the GCT thyristor 90 shown in FIG. 9, for example. While an example in which the GCT thyristor 90 shown in FIG. 9 is employed as the GCT thyristor will be described below, the GCT thyristor module according to the present invention is not restricted to this example.

Figure 2:
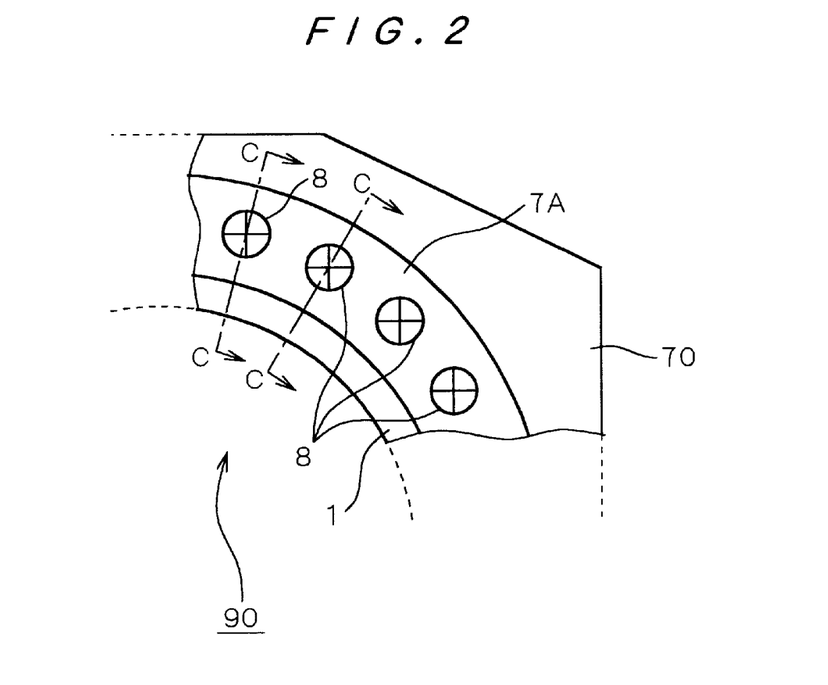
FIG. 2 is a partial plan view showing a module according to the embodiment.
Figure 3:
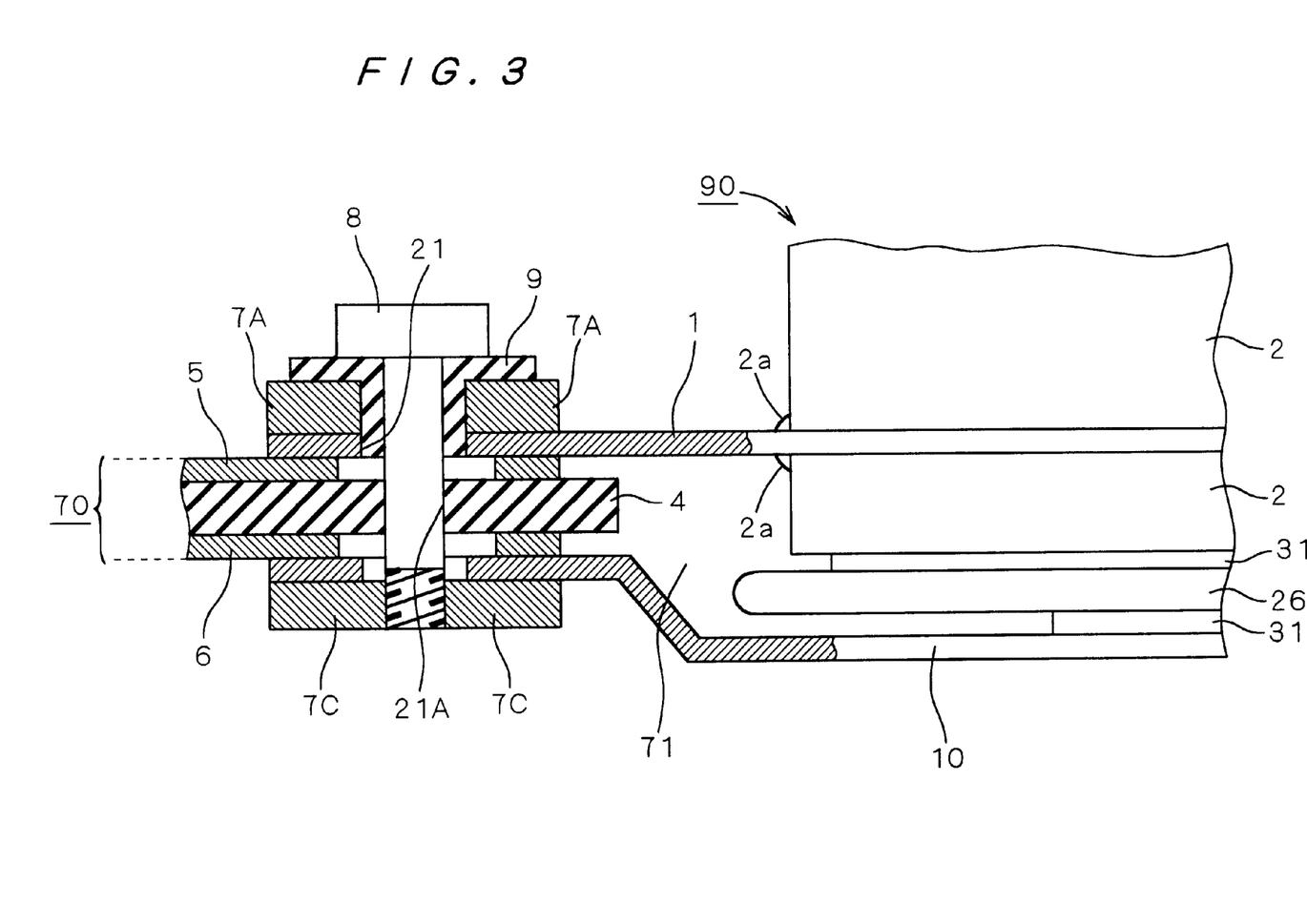
FIG. 3 is a partially sectional side view showing the module according to the embodiment.

FIG. 2 is a partially enlarged plan view showing a part of the periphery of the thyristor inserting section 71 which is obtained after the GCT thyristor 90 is fixed to a connecting substrate 70 and thereby the GCT thyristor module is assembled. FIG. 3 is a sectional view taken along the line C—C in FIG. 2.

As shown in FIGS. 2 and 3, the GCT thyristor 90 is fixed to the connecting substrate 70 through one kind of screw 8, two kinds of metal rings 7A and 7C and a cathode electrode plate 10. Each of the metal rings 7A and 7C and the cathode electrode plate 10 has a high electric conductivity. The connecting substrate 70 is interposed between the gate terminal plate 1 and the cathode electrode plate 10. Furthermore, the gate terminal plate 1 and the cathode electrode plate 10 are interposed between the upper metal ring 7A and the lower metal ring 7C. The upper metal ring 7A and the lower metal ring 7C are fastened with the screw 8 penetrating through a mounting hole 21 and the through hole 21A. Consequently, the GCT thyristor 90 and the connecting substrate 70 are fixed to each other. The screw 8 is formed of a metal.

The connecting substrate 70 has an insulating plate 4, the first metallized layer 5 formed on an upper main surface of the insulating plate 4 and a second metallized layer 6 formed on a lower main surface of the insulating plate 4. Moreover, an insulator 9 is provided between the screw 8 and the metal ring 7A and between the screw 8 and the gate terminal plate 1. Accordingly, the gate terminal plate 1 is electrically connected directly to the first metallized layer 5 and the cathode electrode plate 10 is electrically connected directly to the second metallized layer 6.

Differently from the conventional GCT thyristor module, thus, the metal ring 7B is not provided between the gate terminal plate 1 and the first metallized layer 5. Therefore, it is possible to reduce resistance and inductance components in a path for a gate current. The metal ring 7B is removed, and furthermore, the two kinds of screws 8A and 8B are not required but one kind of screw 8 is enough. Therefore, an assembling step can be more simplified than that in the conventional GCT thyristor module.

Furthermore, the insulator 9 is constituted as a cylinder having a flange on one of ends thereof. Therefore, a complicated work is not required at the assembling step, and reliable insulation can be obtained between the screw 8 and the metal ring 7A and between the screw 8 and the gate terminal plate 1. Preferably, the cathode electrode plate 10 is formed of a non-magnetic metal. Thereby, when the GCT thyristor module performs a high-frequency operation, it is possible to suppress a phenomenon in which an electromagnetic induction is locally applied through a magnetic field generated by an external circuit, resulting in heat generation.

Figure 4:
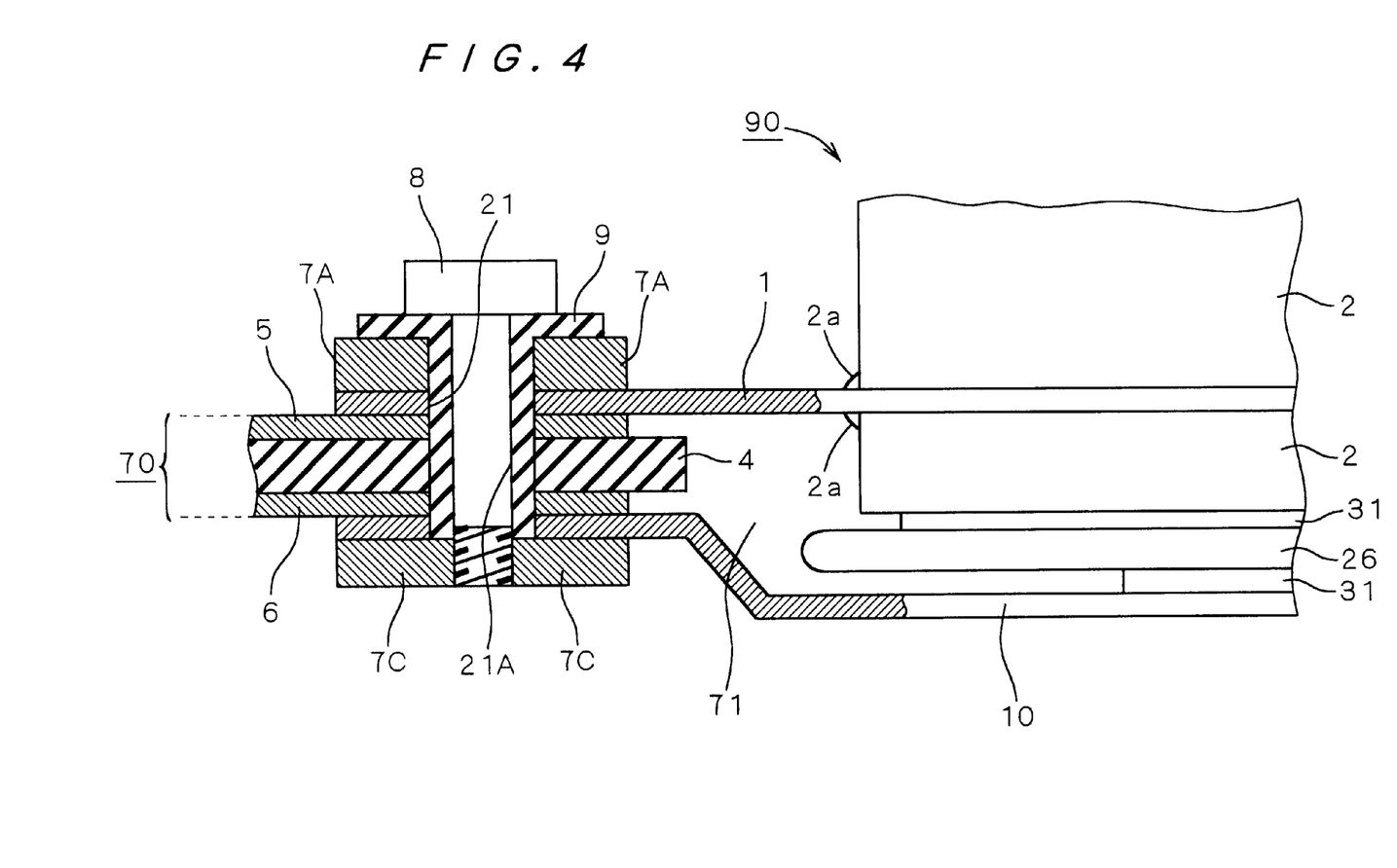
FIG. 4 is a partially sectional side view showing another example of the module according to the embodiment.

As shown in FIG. 4, the insulator 9 is a cylinder having a flange, and furthermore, may be formed to penetrate through the first metallized layer 5 and the second metallized layer 6. Thereby, it is also possible to enhance insulating properties between the first and second metallized layers 5 and 6 and the screw 8.

Figure 5:
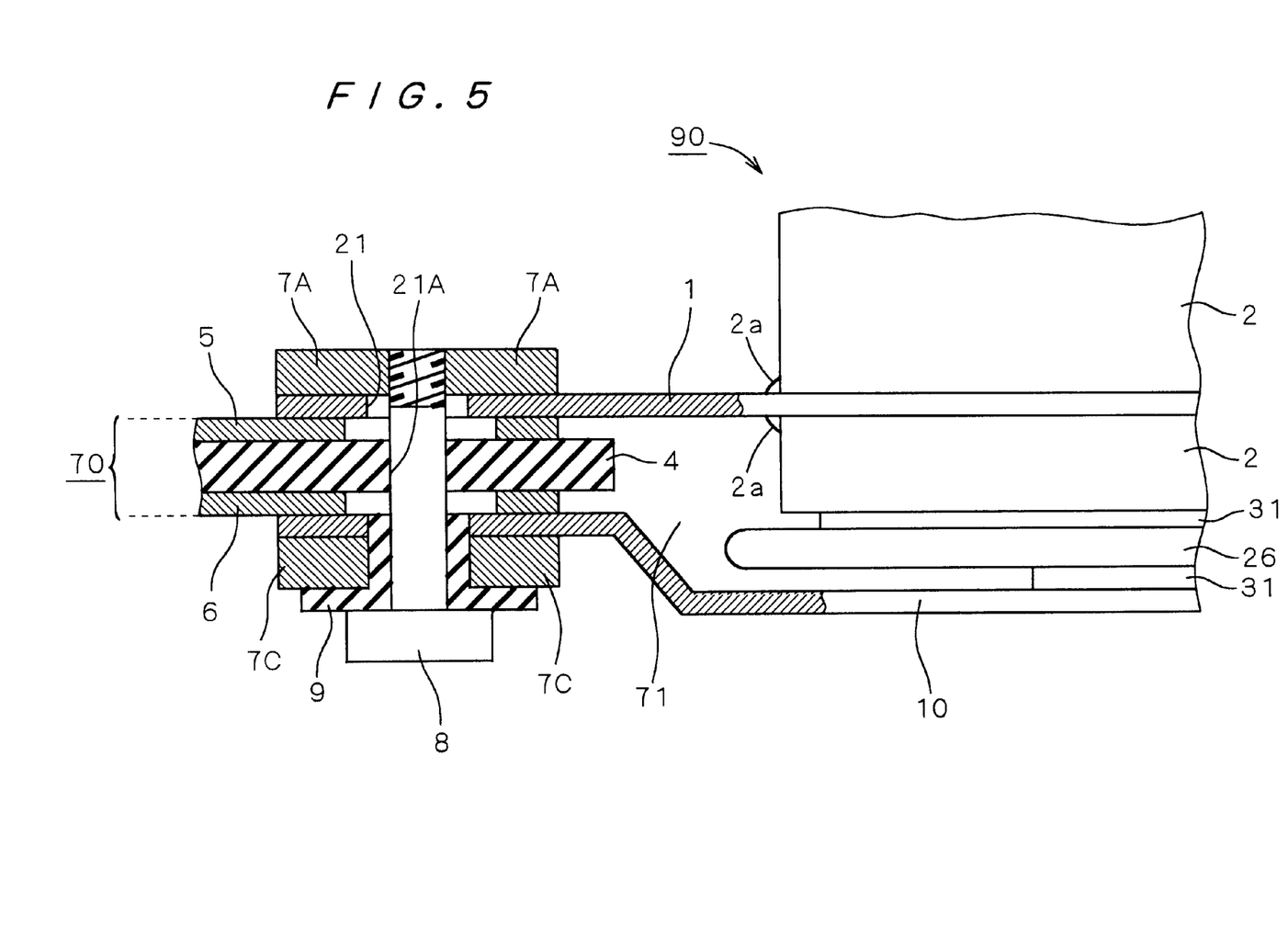
FIG. 5 is a partially sectional side view showing yet another example of the module according to the embodiment.
Figure 6:
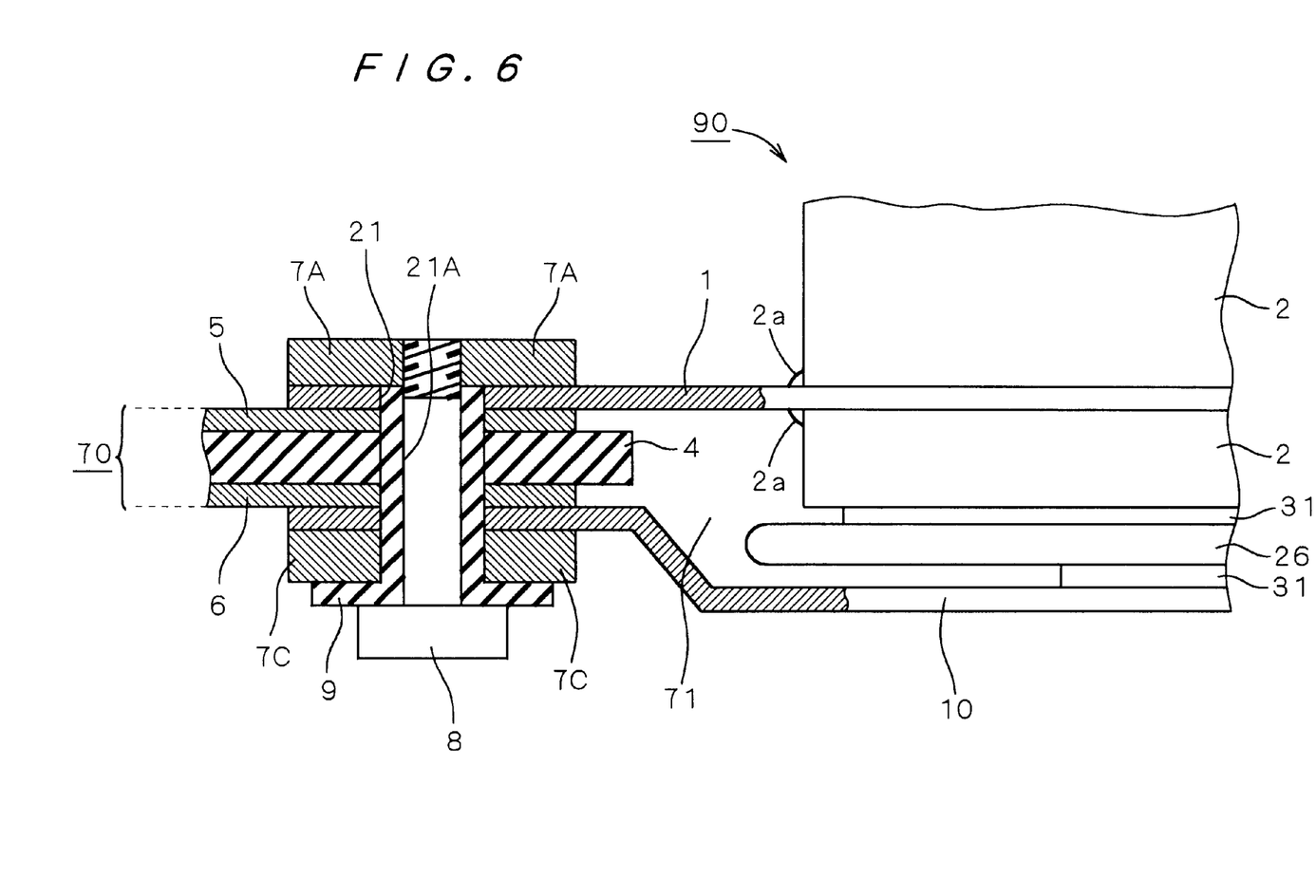
FIG. 6 is a partially sectional side view showing a further example of the module according to the embodiment.

FIGS. 3 and 4 show an example in which the screw 8 is screwed to the lower metal ring 7C, and the upper metal ring 7A and the gate terminal plate 1 are electrically insulated by the insulator 9. On the other hand, as shown in FIG. 5 or 6, the screw 8 may be screwed to the metal ring 7A and may be electrically insulated from the lower metal ring 7A and the cathode electrode plate 10 through the insulator 9. The insulator 9 is formed as a cylinder having a flange and penetrates through the lower metal ring 7C and the cathode electrode plate 10 in the example of FIG. 5, and penetrates from the lower metal ring 7C to the first metallized layer 5 in the example of FIG. 6.

Figure 7:
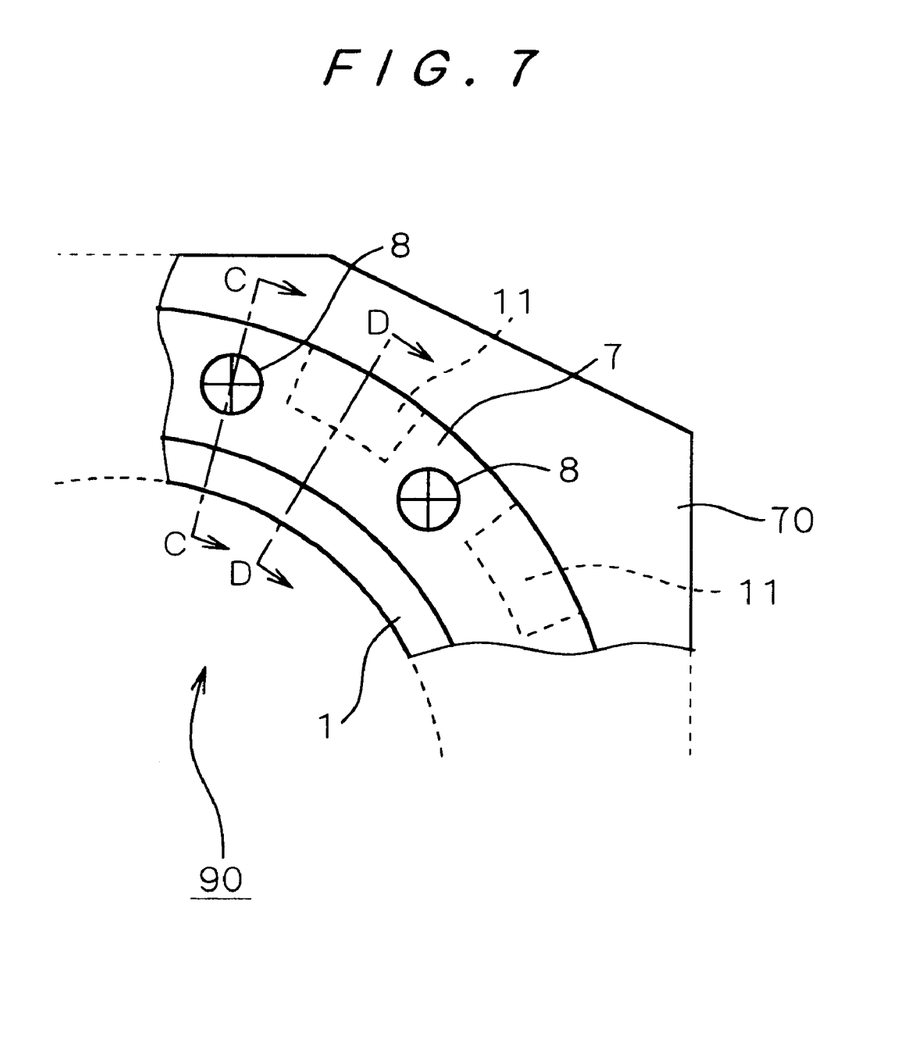
FIG. 7 is a partial plan view showing a further example of the module according to the embodiment.
Figure 8:
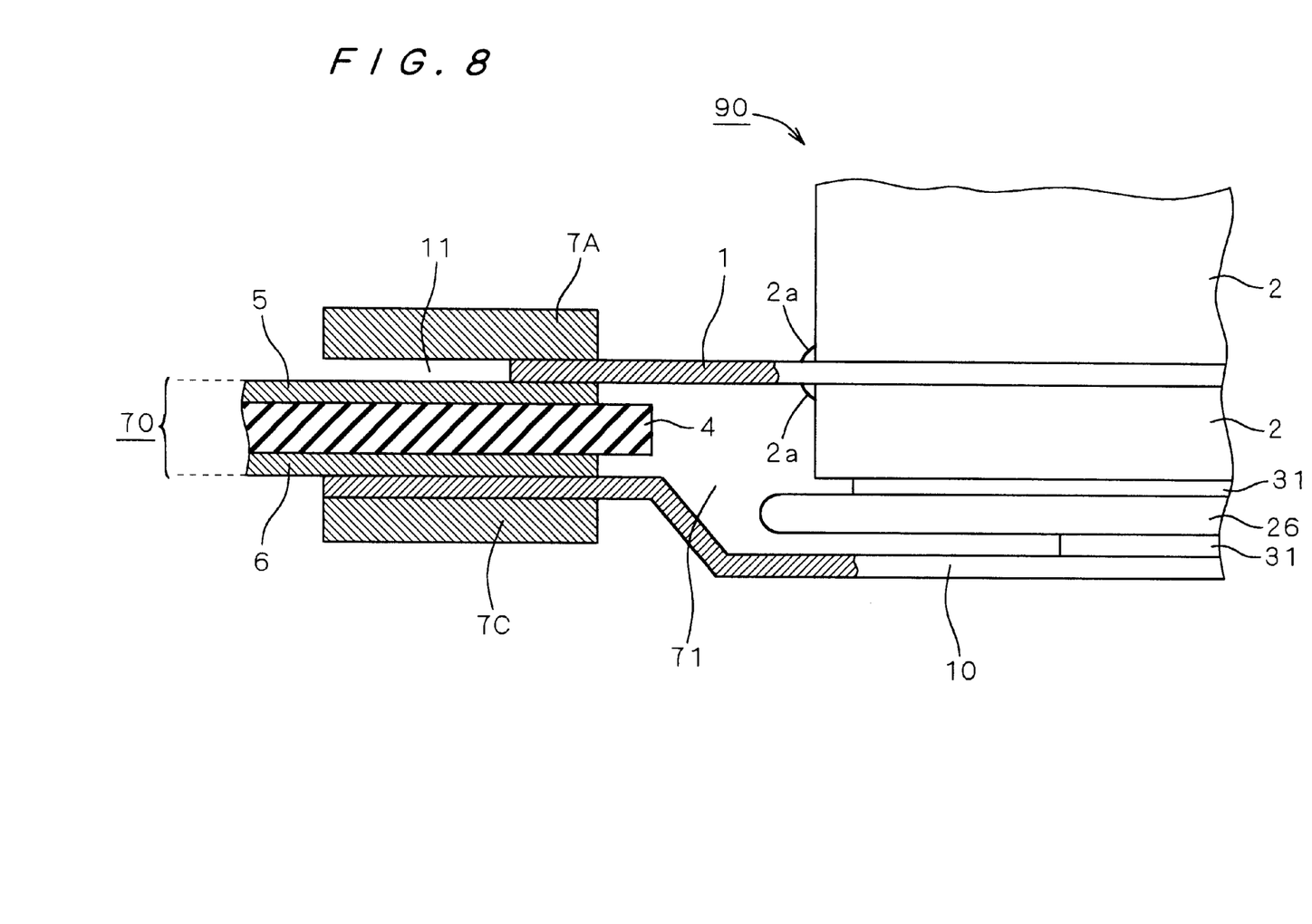
FIG. 8 is a partially sectional side view showing the module illustrated in FIG. 7.

As shown in FIGS. 7 and 8, furthermore, a notch 11 can also be formed selectively along the outer periphery of the gate terminal plate 1. In this configuration, the driving device may be shown in the plan view of FIG. 10 in place of FIG. 1. FIG. 7 is a partially enlarged plan view showing a part of the periphery of the thyristor inserting section 71 in the GCT thyristor module having the notch 11 on the gate terminal plate 1. A sectional view taken along the line C—C in FIG. 7 is identical to FIG. 3, and FIG. 8 is a sectional view taken along the line D—D in FIG. 7.

As shown in FIGS. 7 and 8, the notch 11 is formed to keep away from the mounting hole 21 portion through which the screw 8 penetrates. Consequently, it is possible to reduce a material of the gate terminal plate 1 without preventing an electrical contact between the gate terminal plate 1 and the first metallized layer 5. Comparatively small press force derived from the fastening force of the screw 8 acts between the gate terminal plate 1 and the first metallized layer 5 in a portion provided apart from the mounting hole 21 through which the screw 8 penetrates. Therefore, even if the notch 11 is formed in this portion, the resistance and inductance components in the path for a gate current are influenced comparatively moderately.

While the invention has been described in detail, the foregoing description is in all aspects illustrative and not restrictive. It is understood that numerous other modifications and variations can be devised without departing from the scope of the invention.

What is claimed is:

1. A gate commutated turn-off thyristor module comprising:
    a) a gate commutated turn-off thyristor including
        1) a semiconductor substrate in which a thyristor element is fabricated,
        2) a set of main electrodes provided with said semiconductor substrate interposed therebetween,
        3) an insulating cylinder surrounding said semiconductor substrate and said set of main electrodes, and
        4) a gate terminal plate electrically connected to a gate electrode of said thyristor element and projected like a ring on an outer periphery of said insulating cylinder;
    b) a driving circuit including
        1) a circuit section for supplying a gate current to said gate terminal plate, and
        2) a connecting substrate having an insulating plate and first and second conductive layers respectively provided on first and second main surfaces of said insulating plate and electrically connected to said circuit section;
    c) a conductive main electrode plate electrically connected to one of said main electrodes;
    d) a set of rings provided to interpose said gate terminal plate and said main electrode plate therebetween with said gate terminal plate abutting on said first conductive layer and said main electrode plate abutting on said second conductive layer;
    e) a screw for fastening said set of rings to each other; and
    f) an insulator for electrically insulating said screw from said gate terminal plate and one of said rings contacting with said gate terminal plate or from said main electrode plate and the other ring contacting with said main electrode plate.

2. The gate commutated turn-off thyristor module according to claim 1, wherein said insulator is a cylinder having a flange on one of ends on which a head of said screw abuts, penetrating through said gate terminal plate and said one of rings or through said main electrode plate and said other ring, and causing said screw to penetrate therethrough.

3. The gate commutated turn-off thyristor module according to claim 2, wherein said cylinder also penetrates through said first and second conductive layers.

4. The gate commutated turn-off thyristor module according to claim 1, wherein a material of said main electrode plate is a non-magnetic substance.

5. The gate commutated turn-off thyristor module according to claim 1, wherein a notch is formed in a portion other than said portion through which said screw penetrates in an annular region of said gate terminal plate covered with said one of rings.

* * * * *